(12) United States Patent
Lee et al.

(10) Patent No.: US 10,680,589 B2
(45) Date of Patent: Jun. 9, 2020

(54) GAN BASED FAIL-SAFE SHUTDOWN OF HIGH-CURRENT DRIVERS

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US)

(73) Assignee: Efficient Power Conversion Corporation, El Segundo, CA (US)

(*) Notice: Subject to any disclaimer, the term of this patent is extended or adjusted under 35 U.S.C. 154(b) by 0 days.

(21) Appl. No.: 16/554,042

(22) Filed: Aug. 28, 2019

(65) Prior Publication Data

US 2020/0076411 A1    Mar. 5, 2020

Related U.S. Application Data

(60) Provisional application No. 62/727,111, filed on Sep. 5, 2018, provisional application No. 62/723,801, filed on Aug. 28, 2018, provisional application No. 62/727,115, filed on Sep. 5, 2018.

(51) Int. Cl.
| | | |
|---|---|---|
| *H03K 3/356* | (2006.01) | |
| *H03K 17/687* | (2006.01) | |
| *H01L 29/20* | (2006.01) | |
| *H01L 29/778* | (2006.01) | |
| *H03K 17/30* | (2006.01) | |

(52) U.S. Cl.
CPC ... *H03K 3/356017* (2013.01); *H01L 29/2003* (2013.01); *H01L 29/7787* (2013.01); *H03K 17/302* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 6,034,449 A | * | 3/2000 | Sakai ............... H01H 9/548 307/139 |
| 6,714,067 B1 | | 3/2004 | Farrenkopf |
| 7,705,685 B2 | | 4/2010 | Ng et al. |
| 8,928,373 B2 | | 1/2015 | Miyazawa |

* cited by examiner

*Primary Examiner* — Jeffery S Zweizig
(74) *Attorney, Agent, or Firm* — Blank Rome LLP

(57) ABSTRACT

A driver shutdown circuit configured to trigger driver shutdown based on the magnitude and duration of the driving current. A first GaN FET is connected to a second GaN FET and an input node and generates a discharging current proportional to the driving current. The discharging current is drawn from a timer capacitor through the first and second GaN FETs. The second GaN FET receives a control signal and stops flow of the discharging current in between driver pulses so a pre-charger circuit can recharge the timer capacitor to a particular voltage. The discharging current drains the timer capacitor, and a shutdown signal generator outputs a shutdown signal to the driver in response to the voltage on the timer capacitor decreasing below a triggering voltage.

13 Claims, 6 Drawing Sheets

100">

GAN BASED FAIL-SAFE SHUTDOWN OF HIGH-CURRENT DRIVERS

This application claims the benefit of U.S. Provisional Application No. 62/727,111, filed on Sep. 5, 2018; U.S. Provisional Application No. 62/723,801, filed on Aug. 28, 2018; and U.S. Provisional Application No. 62/727,115, filed on Sep. 5, 2018, the entire disclosures of which is hereby incorporated by reference.

BACKGROUND

1. Field of the Invention

The present invention relates generally to enhancement mode gallium nitride (GaN) field effect transistor (FET) based driver shutdown circuits, and more particularly to a driver shutdown circuit for adjusting the delay before triggering driver shutdown based on the magnitude of the driving current.

2. Description of the Related Art

High-current drivers sink or source very large currents, on the order of tens of amperes (A) in some applications. Some high-current drivers, such as laser drivers in light detection and ranging (lidar) systems, must automatically shut down under certain conditions in order to meet safety regulations. For example, to meet eye safety regulations lidar drivers must include fail-safe shutdown systems to automatically shut down the lidar driver when the driver gets stuck in a full or extended laser active command cycle. The laser eye safety regulations for lidar drivers depend on both the magnitude of the driving current and the duration of the pulse. Thus, the regulations require that a very large driving current must trigger shutdown more quickly than a very small driving current.

Typical fail-safe shutdown circuits use time constants associated with capacitors, resistors, or inductors to control the delay before triggering shutdown. FIG. 1 is a schematic of a conventional shutdown circuit based on a capacitor and a resistor. Shutdown (SD) circuit 100 includes a capacitor 115, a resistor 120, and a buffer 125. A control signal CTL 105 is applied to the input node, and capacitor 115 and resistor 120 differentiate CTL 105, transforming it into pulse edges which are output from buffer 125 as a shutdown signal 130. The pulse width of shutdown signal 130 depends on the rise time of CTL 105 and the RC time constant.

Disadvantageously, the amplitude of shutdown signal 130 decays as CTL 105 maintains a constant value, which makes it difficult for a driver receiving shutdown signal 130 to separate shutdown signal 130 from noise near a threshold between turn-off and turn-on. Further, it is difficult to vary the RC time constant to accommodate different pulse frequencies in CTL 105, and a very large driving current triggers shutdown of the driver at the same time as a small driving current.

FIG. 2 is a schematic of a conventional shutdown circuit based on a p-type current mirror or a depletion mode transistor charging a capacitor. SD circuit 200 includes a reference current source 220, a current mirror 225, a capacitor 245, a transistor 250, and a buffer 255. Reference current source 220 generates a reference current $I_{REF}$ that is mirrored by current mirror 225 to generate a charging current $I_{CHG}$ for capacitor 245. In some implementations, a depletion mode transistor acting as a current source is used instead of reference current source 220 and current mirror 225. In response to capacitor 245 being charged to a triggering voltage $V_{TRIG}$, buffer 255 outputs shutdown signal 260.

Disadvantageously, the delay before shutdown signal 260 is output is constant, regardless of the magnitude of the driving current output by the associated driver circuit. Further, transistors 230 and 235 in current mirror 225 or the depletion mode transistor used in their place must have low absolute values of threshold voltages $V_{Th}$ to implement shutdown circuit 200 in a single integrated circuit. P-type transistors cannot presently be implemented as GaN FETs, and so current mirror 225 must be implemented using silicon-based transistors instead, which switch more slowly than GaN FETs and cannot withstand voltages and currents as high as GaN FETs.

SUMMARY OF THE INVENTION

The present invention addresses the disadvantages of conventional fail-safe shutdown circuits, discussed above, by providing a driver shutdown circuit capable of adjusting the delay before triggering shutdown based on the magnitude of the driving current. The driver shutdown circuit of the present invention can be monolithically integrated with its associated driver circuit.

The present invention, as described herein, comprises a first GaN FET, a second GaN FET, a pre-charger circuit, a timer capacitor, and a shutdown signal generator. The first GaN FET has a first gate terminal connected to an input node, a first drain terminal, and a first source terminal. The second GaN FET has a second gate terminal configured to receive a control signal, a second drain terminal connected to a first node, and a second source terminal connected to the first drain terminal. The timer capacitor is connected to the first node and ground. The first GaN FET generates a discharging current which is proportional to the driving current and drawn from the timer capacitor. The second GaN FET stops the flow of the discharging current when the control signal indicates the driving current is not being generated.

The pre-charger circuit is connected to the first node and configured to receive the control signal. Even though the timer capacitor is discharged while the driver is active, the pre-charger circuit has sufficient time to recharge the timer capacitor to the desired voltage level while the driver is inactive. The shutdown signal generator is connected to the first node and outputs a shutdown signal to an output node in response to the voltage on the first node decreasing below the triggering voltage of the shutdown signal generator.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed, and that various structural, logical, and electrical changes may be made. The combinations of features disclosed in the following detailed description may not be necessary to practice the teachings in the broadest sense and are instead taught merely to describe particularly representative examples of the present teachings.

Figure 2:
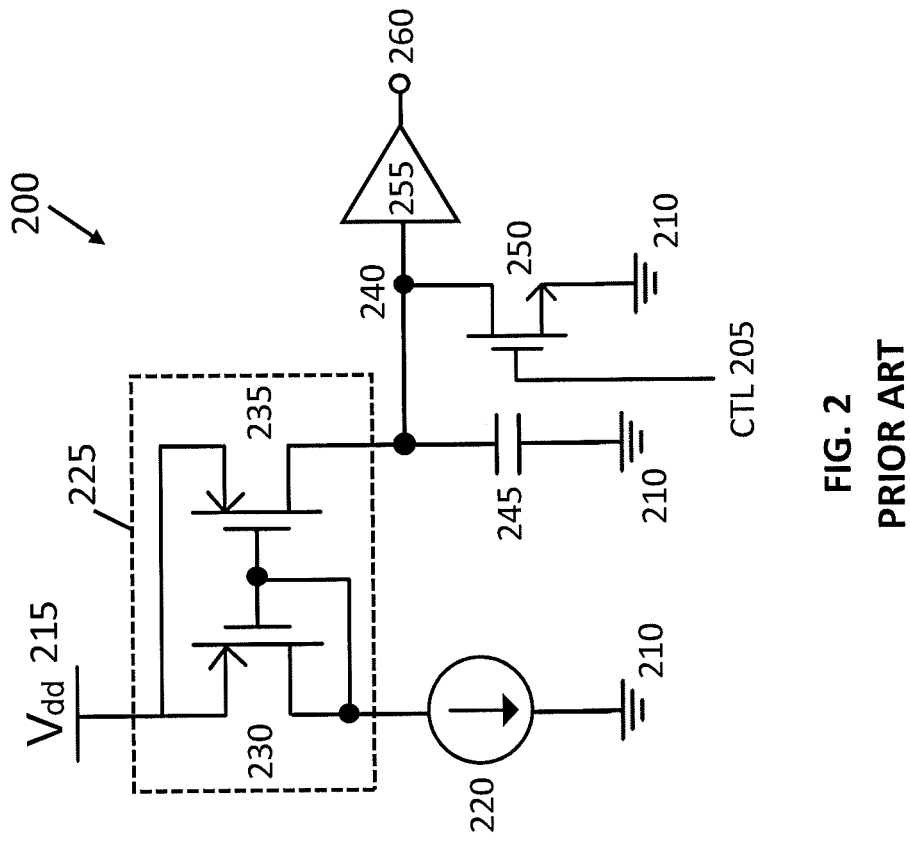
FIG. 2 is a schematic of a conventional shutdown circuit based on a p-type current mirror or a depletion mode transistor charging a capacitor.
Figure 1:
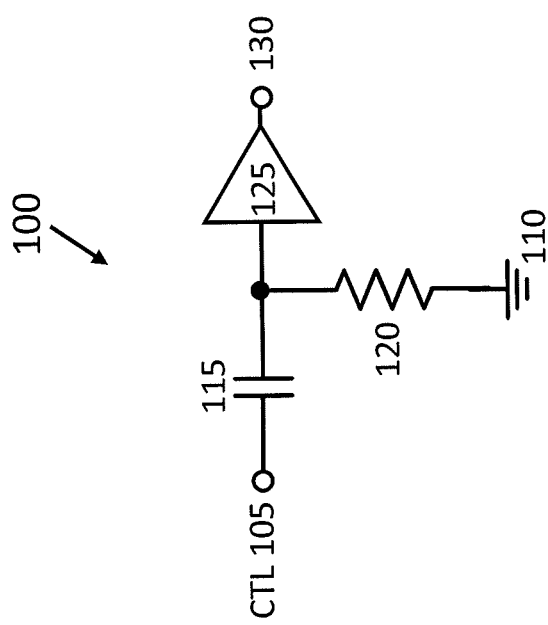
FIG. 1 is a schematic of a conventional shutdown circuit based on a capacitor and a resistor.
Figure 3:
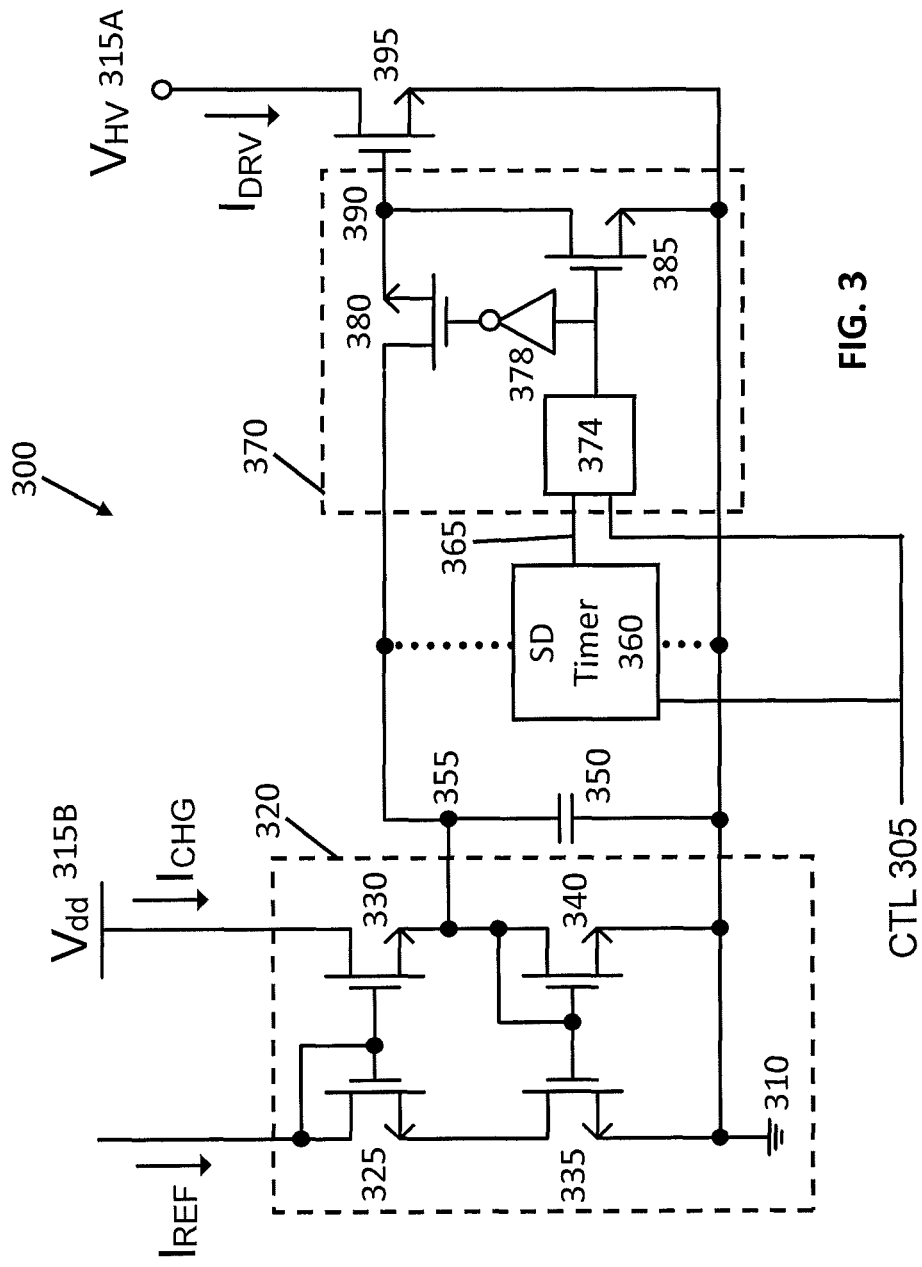
FIG. 3 illustrates an adjustable current driver circuit for use in combination with the fail-safe shutdown controller according to the present invention.

FIG. 3 illustrates an adjustable current driver circuit 300 for use in combination with the fail-safe shutdown circuit according to the present invention. Adjustable current driver circuit 300 includes current mirror 320, capacitor 350, pulse controller 370, and driving transistor 395. Current mirror 320 receives the reference current $I_{REF}$ and outputs a charging current $I_{CHG}$ for capacitor 350. Current mirror 320 is connected to ground 310, to capacitor 350 and pulse controller 370 at node 355, and to supply voltage 315B which provides a supply voltage $V_{dd}$. Capacitor 350 is further connected to ground 310. Current mirror 320 includes transistors 325, 330, 335, and 340. Pulse controller 370 includes gate driver 374, inverter 378, and transistors 380 and 385. Transistors 325, 330, 335, and 340 in current mirror 320, transistors 380 and 385 in pulse controller 370, and driving transistor 395 are preferably enhancement mode GaN FET semiconductor devices, which are monolithically integrated onto a single semiconductor die. Components in adjustable current driver circuit 300 are described as being connected to ground 310, but in other implementations are connected to a floating node instead.

Current mirror 320 draws $I_{CHG}$ from supply voltage source 315B based on $I_{REF}$, and $I_{CHG}$ charges capacitor 350 to a desired voltage that will be applied to the gate terminal of driving transistor 395. Changes to the value of $I_{REF}$ result in changes in the value of $I_{CHG}$ and the voltage across capacitor 350. A voltage across capacitor 350 for a given $I_{REF}$ changes in response to variations in temperature, supply voltage, circuit impedances, and process variations, which ensures that the driving current $I_{DRV}$ is always a scaled value of $I_{REF}$ regardless of variations in temperature, supply voltage, circuit impedances, and process variations. The capacitance of capacitor 350 is much larger than the input capacitance $C_{ISS}$ of driving transistor 395. In this example, current mirror 320 receives the reference current $I_{REF}$ and generates the charging current $I_{CHG}$ from supply voltage source 315B to control the supply voltage $V_{dd}$ available for adjustable current driver circuit 300. In other implementations, the reference current $I_{REF}$ is applied directly to node 355 and directly charges capacitor 350.

The gate voltage for generating a specific value of low through driving transistor 395 is drawn from the charge stored on capacitor 350, rather than from a supply voltage source, which greatly reduces supply voltage spiking from the near-instantaneous current draw from the supply voltage source. The reduced supply voltage spiking reduces resistive and inductive noise spikes in other pre-driver circuits as well. Energy discharged from capacitor 350 while driving transistor 395 acts as a closed switch is replenished by $I_{CHG}$ while driving transistor 395 acts as an open switch. $I_{CHG}$ is a similar order of magnitude as $I_{REF}$ and is sufficient to recharge capacitor 350 in between pulses of transistor 395 despite its much smaller magnitude. $I_{REF}$ is highly scaled down compared to the much larger driving current low drawn from the much larger supply voltage source 315A and is achieved based on the relative sizes of transistors in current mirror 320 compared to driving transistor 395. For example, transistors 335 and 340 are substantially the same size, and driving transistor 395 is approximately 30,000 times the size of transistors 335 and 340. An low equal to 30 A is achieved with an $I_{REF}$ of only 1 mA. Varying the magnitude of $I_{REF}$ varies the magnitude of $I_{DRV}$ proportionally.

Pulse controller 370 is connected to node 355 and the gate terminal of driving transistor 395 at node 390 and receives a control signal CTL 305 and a shutdown signal 365 from shutdown (SD) timer 360. When CTL 305 indicates driving transistor 395 should be turned on and $I_{DRV}$ generated, transistor 385 acts as an open switch and disconnects the gate terminal of driving transistor 395 from ground 310. Transistor 380 acts as a closed switch and connects the gate terminal of transistor 395 to capacitor 350 at node 355. The charge stored on capacitor 350 increases the voltage on the gate terminal of driving transistor 395 above $V_{Th}$, causing it to turn on and generate $I_{DRV}$. When CTL 305 or shutdown signal 365 indicates driving transistor 395 should be turned off, transistor 380 acts as an open switch and disconnects the gate terminal of driving transistor 395 from capacitor 350. Transistor 385 acts as a closed switch and connects the gate terminal of driving transistor 395 to ground 310, causing the gate voltage of driving transistor 395 to quickly decrease to ground.

The drain terminal of driving transistor 395 is connected to a second supply voltage source 315A, which provides a supply voltage $V_{HV}$ that is much higher than $V_{dd}$ from supply voltage source 315B. $I_{DRV}$ is drawn from the second supply voltage source 315A. SD timer 360 is connected to node 355 and ground 310 as a safety feature to turn off driving transistor 395 based on the magnitude of $I_{REF}$ and the corresponding $I_{DRV}$, and receives CTL 305. If $I_{REF}$ indicates a high magnitude for $I_{DRV}$, SD timer 360 generates shutdown signal 365 for pulse controller 370 to turn off driving transistor 395 after only a short delay. If $I_{REF}$ indicates a low magnitude for $I_{DRV}$, SD timer 360 generates shutdown signal 365 for pulse controller 370 to turn off driving transistor 395 after a long delay. Thus, SD timer 360 implements a variable delay before generating shutdown signal 365 that is dependent on the magnitude of the driving current $I_{DRV}$, yet ensures the total energy emitted does not exceed a user-defined threshold regardless of the magnitude of the driving current $I_{DRV}$.

In an exemplary implementation of adjustable current driver circuit 300 as part of a lidar system, varying the magnitude of $I_{REF}$ proportionally varies the magnitude of $I_{DRV}$ and the corresponding intensity of light emitted by the laser diode driven by $I_{DRV}$. Thus, the lidar system can carefully control the light intensity based on the range of distances it is imaging and environmental conditions. $I_{DRV}$ can be dynamically adjusted as the lidar system images the environment to accommodate changes in the environmental conditions as well. Dynamic adjustment of $I_{DRV}$ enables the lidar system to adjust for different distances, maintain a constant light intensity over different environmental and process conditions, and/or modulate the light intensity over time to implement a time-of-flight imaging process.

Figure 4:
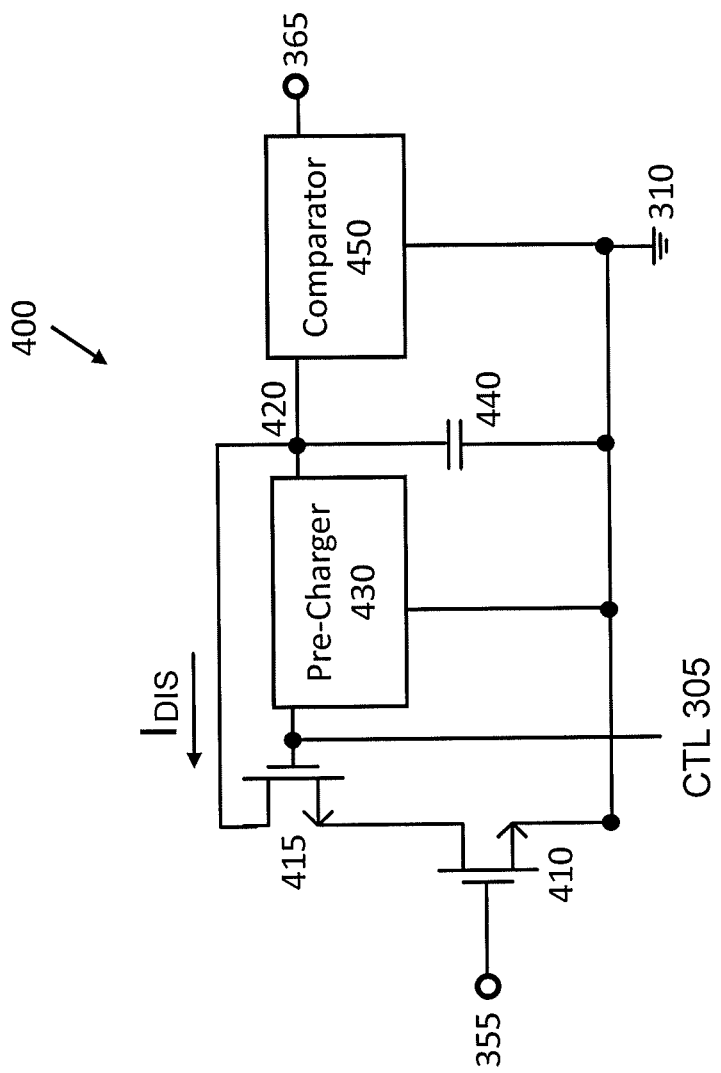
FIG. 4 illustrates a shutdown controller according to the present invention for the adjustable current driver circuit shown in FIG. 3.

FIG. 4 illustrates a shutdown timer according to the present invention for the adjustable current driver circuit 300 shown in FIG. 3. SD timer 400 can be used as SD timer 360, which is shown in block diagram form in FIG. 3, and includes transistors 410 and 415, pre-charger circuit 430, timer capacitor 440, and comparator 450. Transistors 410 and 415 are preferably enhancement mode GaN FET semiconductor devices and monolithically integrated onto a single semiconductor die with the other components of SD timer 400. The gate terminal of transistor 410 is connected to node 355, and the source terminal of transistor 410 is connected to ground 310. The drain terminal of transistor 410 is connected to the source terminal of transistor 415. The gate terminal of transistor 415 receives CTL 305. The drain terminal of transistor 415 is connected to the pre-charger circuit 430, timer capacitor 440, and comparator 450 at node 420.

Transistor 410 acts as an additional output of current mirror 320 and generates a discharging current loss proportional to $I_{REF}$, which is drawn from timer capacitor 440. In response to $I_{REF}$ indicating a high magnitude for $I_{DRV}$, $I_{DIS}$ is larger and quickly decreases the voltage on node 420 from timer capacitor 440 below a threshold voltage for comparator 450, causing it to generate shutdown signal 365 for pulse controller 370 after only a short delay. In response to $I_{REF}$ indicating a low magnitude for $I_{DRV}$, $I_{DIS}$ slowly decreases the voltage on node 420 from timer capacitor 440 below the threshold voltage for comparator 450, causing it to generate shutdown signal 365 for pulse controller 370 after a long delay.

In some embodiments, the size of transistor 410 relative to transistors 325, 330, 335, and 340 in current mirror 320 is used to scale $I_{DIS}$ compared to $I_{REF}$. In some embodiments, multiple transistors 410A-N can be connected in parallel to set a baseline shutdown delay for a particular application, such as when $I_{REF}$ is applied directly to node 355. When CTL 305 indicates driving transistor 395 is to be turned off and no $I_{DRV}$ flows, transistor 415 stops the flow of $I_{DIS}$ to allow pre-charger circuit 430 to recharge timer capacitor 440.

Pre-charger circuit 430 determines the charge stored on timer capacitor 440, which affects the delay before SD timer 400 triggers shutdown of driving transistor 395. The voltage across timer capacitor 440 is a scaled multiple of $V_{Th}$ and mirrors changes in $V_{Th}$ due to temperature, supply voltage, circuit impedances, and process variations to ensure that the $I_{DIS}$ for a given $I_{REF}$ remains constant. Even though timer capacitor 440 is discharged during the activation of the driver circuit, pre-charger circuit 430 recharges timer capacitor 440 to a consistent voltage while the driver is off.

Pre-charger circuit 430 enters a "hold" state in response to CTL 305 indicating driving transistor 395 is to be turned on, when $I_{DIS}$ discharges timer capacitor 440 through transistors 415 and 410. Comparator 450 outputs the shutdown signal 365 to pulse controller 370 when the voltage at node 420 across timer capacitor 440 decreases below the threshold voltage for comparator 450, causing driving transistor 395 to shut off. In some embodiments, comparator 450 is an inverter.

$I_{DIS}$ is proportional to $I_{REF}$ and the corresponding $I_{DRV}$. $I_{DIS}$ drains timer capacitor 440 more quickly and the voltage on node 420 decreases below the threshold voltage for comparator 450 more quickly in response to a larger $I_{REF}$ and the corresponding larger $I_{DRV}$. $I_{DIS}$ drains timer capacitor 440 more slowly and the voltage on node 420 decreases below the threshold voltage for comparator 450 more slowly in response to a smaller $I_{REF}$ and the corresponding smaller $I_{DRV}$. Thus, SD timer 400 is able to adjust the delay before triggering shutdown of adjustable current driver 300 based on the magnitude of $I_{DRV}$.

Figure 5:
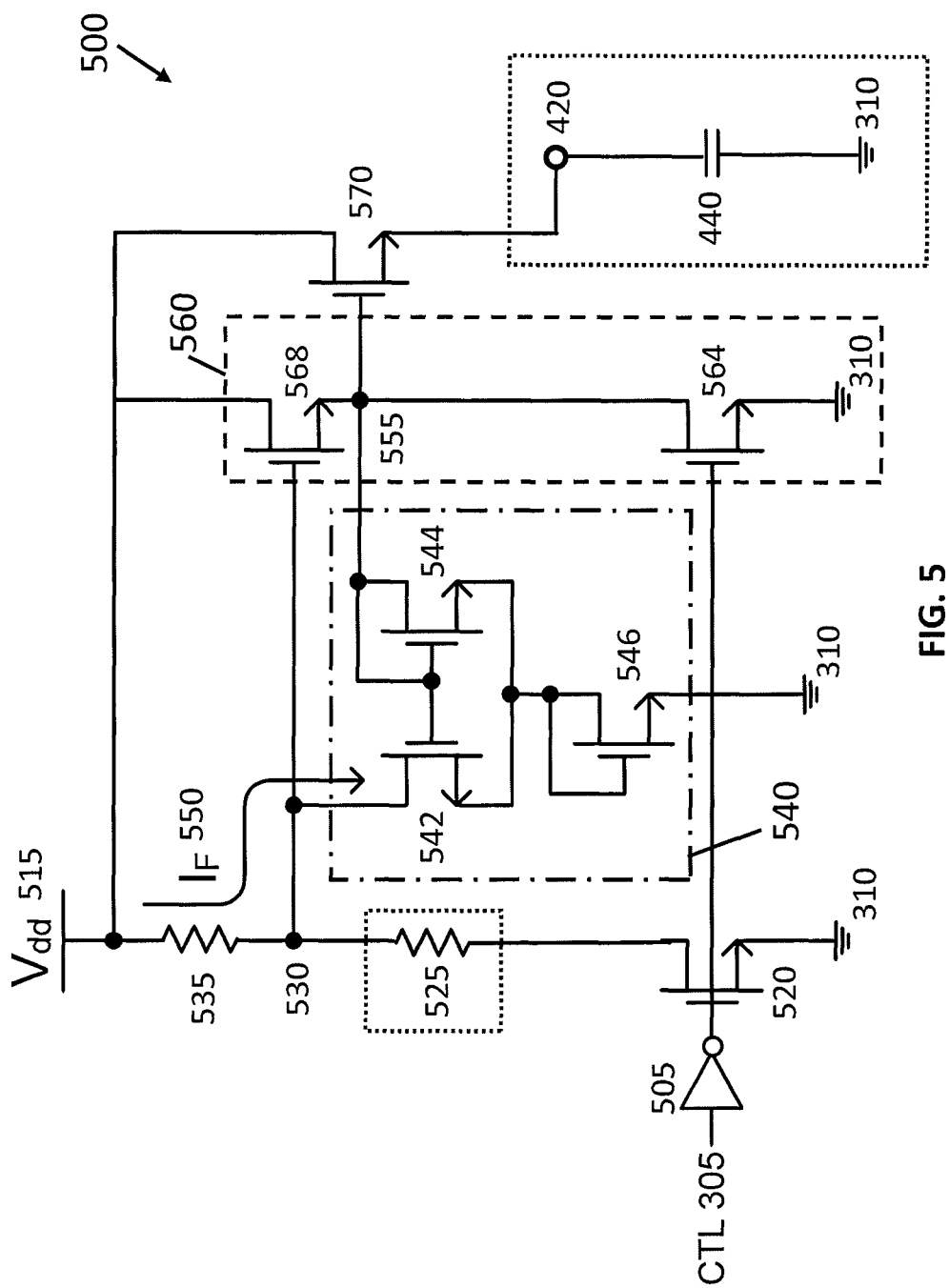
FIG. 5 illustrates a pre-charger circuit according to the present invention for the shutdown controller shown in FIG. 4.

FIG. 5 illustrates a shutdown pre-charger circuit according to the present invention for the fail-safe SD timer 400 shown in FIG. 4. Pre-charger circuit 500 can be used as pre-charger circuit 430, which is shown in block diagram form in FIG. 4, and is used to control the amount of time before driver shutdown is triggered. Pre-charger circuit 500 is able to carefully control the voltage on output node 420, which is used to charge timer capacitor 440. Even though timer capacitor 440 is discharged by different amounts during different pulses, pre-charger circuit 500 recharges timer capacitor 440 to a consistent voltage so that the delay before the timer capacitor is discharged below the threshold voltage for comparator 450 depends only on $I_{DIS}$ and $I_{REF}$.

Pre-charger circuit 500 includes transistors 520 and 570, resistors 525 and 535, feedback circuit 540, and output stage 560. Feedback circuit 540 includes transistors 542, 544, and 546, and output stage 560 includes transistors 564 and 568. Transistors 520, 542, 544, 546, 564, 568, and 570 are preferably enhancement mode GaN FET semiconductor devices, which are monolithically integrated with the other components of pre-charger circuit 500 and the associated SD timer 400 onto a single semiconductor die.

The gate terminal of transistor 520 receives the inverse of CTL 305 from inverter 505, and the source terminal of transistor 520 is connected to ground 310. The drain terminal of transistor 520 is connected to resistor 525, which is further connected to node 530. Resistor 525 is chosen such that the voltage drop across resistor 525 is less than the $V_{Th}$ of transistor 568 in output stage 560 in response to the inverse of CTL 305 being logic high, keeping transistor 568 turned off. In some embodiments, resistor 525 is omitted, and higher parasitic currents are experienced. Resistor 535 is connected to node 530 and to supply voltage source 515, which provides a supply voltage $V_{dd}$. In other embodiments, resistor 535 can be replaced by a depletion mode transistor which acts as a current source.

In output stage 560, the gate terminal of transistor 564 receives the inverse of CTL 305, and the source terminal of transistor 564 is connected to ground 310. The drain terminal of transistor 564 is connected to the source terminal of transistor 568 and the gate terminal of transistor 570 at node 555. The drain terminal of transistor 568 is connected to the supply voltage source 515. Transistor 568 is an active pull-up FET and is smaller than transistor 570. Because transistor 568 is smaller, it consumes less driving current and turns on more quickly than a constant current load or a resistive load. Further, resistor 535 can be larger to reduce static current through shutdown pre-charger circuit 500. The drain terminal of transistor 570 is connected to supply voltage source 515, and the source terminal of transistor 570 is connected to output node 420.

Feedback circuit 540 is connected to nodes 530 and 555 and is configured to control a voltage on node 555. In response to the voltage on node 555 exceeding a predetermined range, feedback circuit 540 generates a feedback current IF 550, causing a voltage drop across resistor 535 and reducing the gate voltage of transistor 568. As a result, the voltage on the source terminal of transistor 568 and the gate voltage of transistor 570 decreases to within the predetermined range. Transistor 570 decreases the voltage on its source terminal at output node 420, and, by extension, the energy stored in timer capacitor 440 connected to output node 420.

Feedback circuit 540 comprises a simple current mirror made up of transistors 542, 544, and 546. The drain and gate terminals of transistor 544 and the gate terminal of transistor 542 are connected together at node 555. The source terminal of transistor 544 and the source terminal of transistor 542 are connected together and to the drain and gate terminals of transistor 546. The source terminal of transistor 546 is connected to ground 310, and transistor 546 is configured as a diode. The drain terminal of transistor 542 is connected to node 530.

The voltage that feedback circuit 540 maintains on node 555 is adjusted by adding more transistors configured as diodes below the simple current mirror of transistors 542 and 544. For feedback circuit 540 which includes one transistor 546 configured as a diode, the desired voltage is equal to the threshold voltages $V_{Th}$ and the overdrive voltages $V_{OV}$ of transistors 544 and 546. For N diodes configured as transistors connected to transistors 542 and 544, the desired voltage is equal to $(N+1)(V_{Th}+V_{OV})$. Two currents charge transistor 546 above $V_{Th}$: the current through transistor 542 and the current through transistor 544.

Pre-charger circuit 500 includes output stage 560 to isolate feedback circuit 540 from output node 420. Transistor 568 acts as a source follower and reduces the current that transistor 544 must withstand, also reducing its size and the static current through feedback circuit 540. For a capacitive load like timer capacitor 440 and in response to the voltage on output node 420 being the desired voltage, transistor 570 turns off and acts as an open switch, disconnecting output node 420 and timer capacitor 440 from supply voltage source 515 and isolating them from noise in $V_{dd}$.

In response to the inverse of CTL 305 being logic high, transistors 520 and 564 act as closed switches, connecting nodes 530 and 555 to ground 310, respectively. The voltage on node 555 quickly decreases to ground, turning off transistor 570 and disconnecting supply voltage source 515 from output node 420. The voltage on node 530 quickly decreases to ground as well, turning off transistor 568. Current flows only through resistors 535 and 525, which have resistances chosen to reduce current flow in response to the inverse of CTL 305 being logic high and reduce the power consumption of pre-charger circuit 500.

In response to the inverse of CTL 305 being logic low, transistors 520 and 564 act as open switches, disconnecting nodes 530 and 555 from ground 310, respectively. The voltage on node 530 increases above the threshold voltage $V_{Th}$ of transistor 568, turning it on. Transistor 568 acts as a closed switch and connects supply voltage source 515 to node 555. The increasing voltage on node 555 turns on transistor 570, which connects supply voltage source 515 to output node 420. Feedback circuit 540 controls the gate voltage of transistor 570 and the resulting voltage on output node 420. To set a particular voltage $V_{SET}$ on output node 420 and timer capacitor 440, feedback circuit 540 is configured to maintain a voltage equal to $V_{SET}+V_{Th}$ on node 555.

Figure 6:
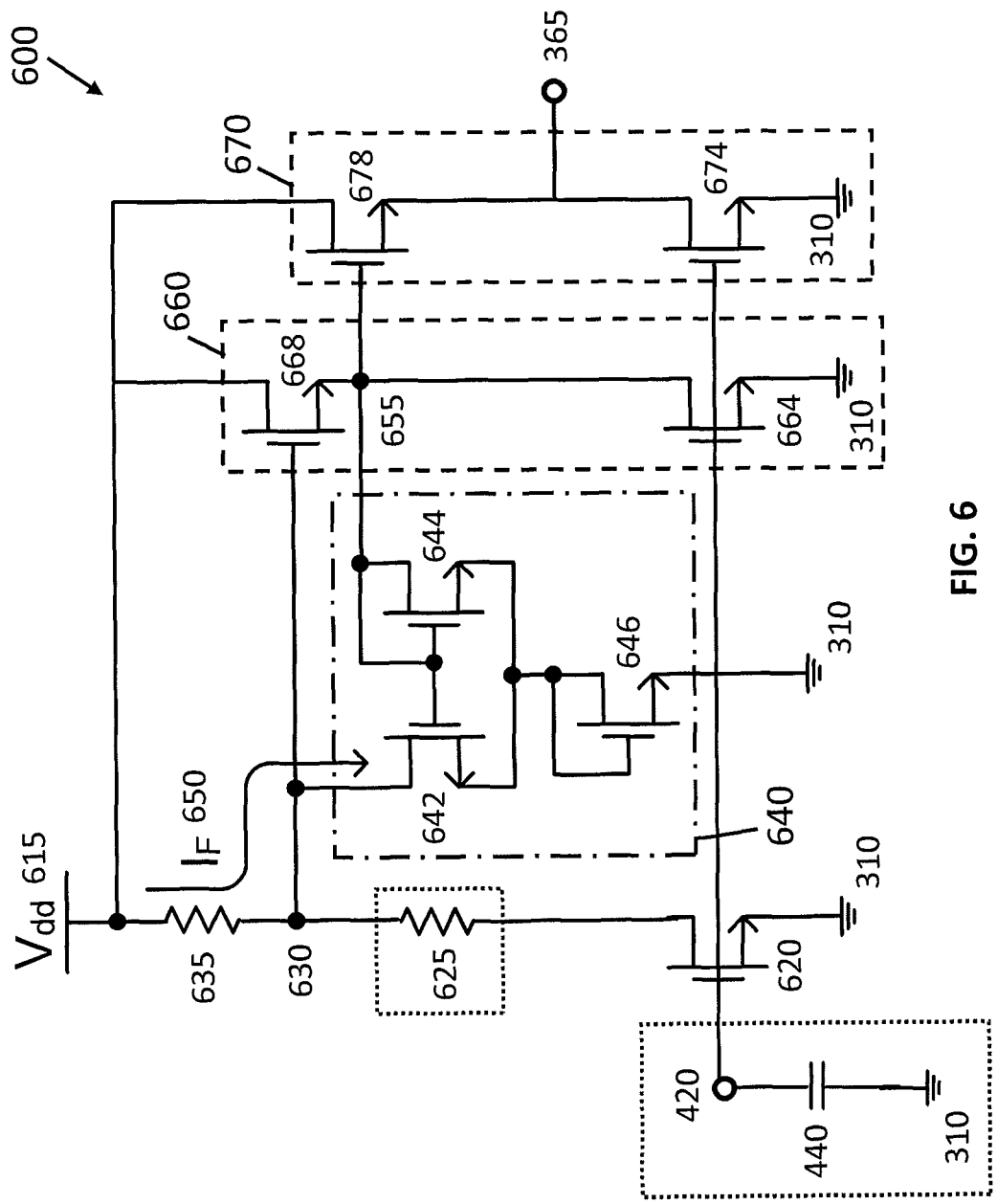
FIG. 6 illustrates a comparator according to the present invention for the shutdown controller shown in FIG. 4.

FIG. 6 illustrates a comparator 600 according to the present invention for the fail-safe SD timer 400 shown in FIG. 4. Comparator 600 can be used as comparator 450, which is shown as in block diagram form in FIG. 4, and is used to output shutdown signal 365 to the pulse controller circuit 370, triggering shutdown of the adjustable current driver circuit 300. Comparator 600 is similar to the SD pre-charger circuit 500 shown in FIG. 5, but includes a second output stage 670 in place of transistor 570. The second output stage 670 is similar to output stage 660 and includes transistors 674 and 678. The gate terminal of transistor 678 is connected to node 655, and the source terminal of transistor 678 and the drain terminal of transistor 674 are connected to pulse controller 370 and provide shutdown signal 365.

The input signal 420 applied to the gate terminals of transistors 620, 664, and 674 corresponds to the voltage on timer capacitor 440. The threshold voltage for comparator 600 corresponds to the $V_{Th}$ of transistors 620, 664, and 674. In response to the voltage on timer capacitor 440 being greater than the threshold voltage for comparator 600, transistors 620, 664, and 674 act as closed switches, connecting resistor 625 and nodes 655 and 675 to ground 310 and decreasing the voltage on nodes 655 and 675.

In response to the voltage 420 on timer capacitor 440 decreasing below the threshold voltage of comparator 600, transistors 620, 664, and 674 act as open switches, disconnecting resistor 625 and nodes 655 and 675 from ground 310 and allowing the voltage on nodes 630, 655, and 675 to increase. The increasing voltage on node 630 causes transistor 668 to turn on, connecting node 655 to supply voltage source 615. The increasing voltage on node 655 causes transistor 678 to turn on, connecting output node 675 to supply voltage source 615 and causing comparator 600 to output shutdown signal 365.

Figure 7:
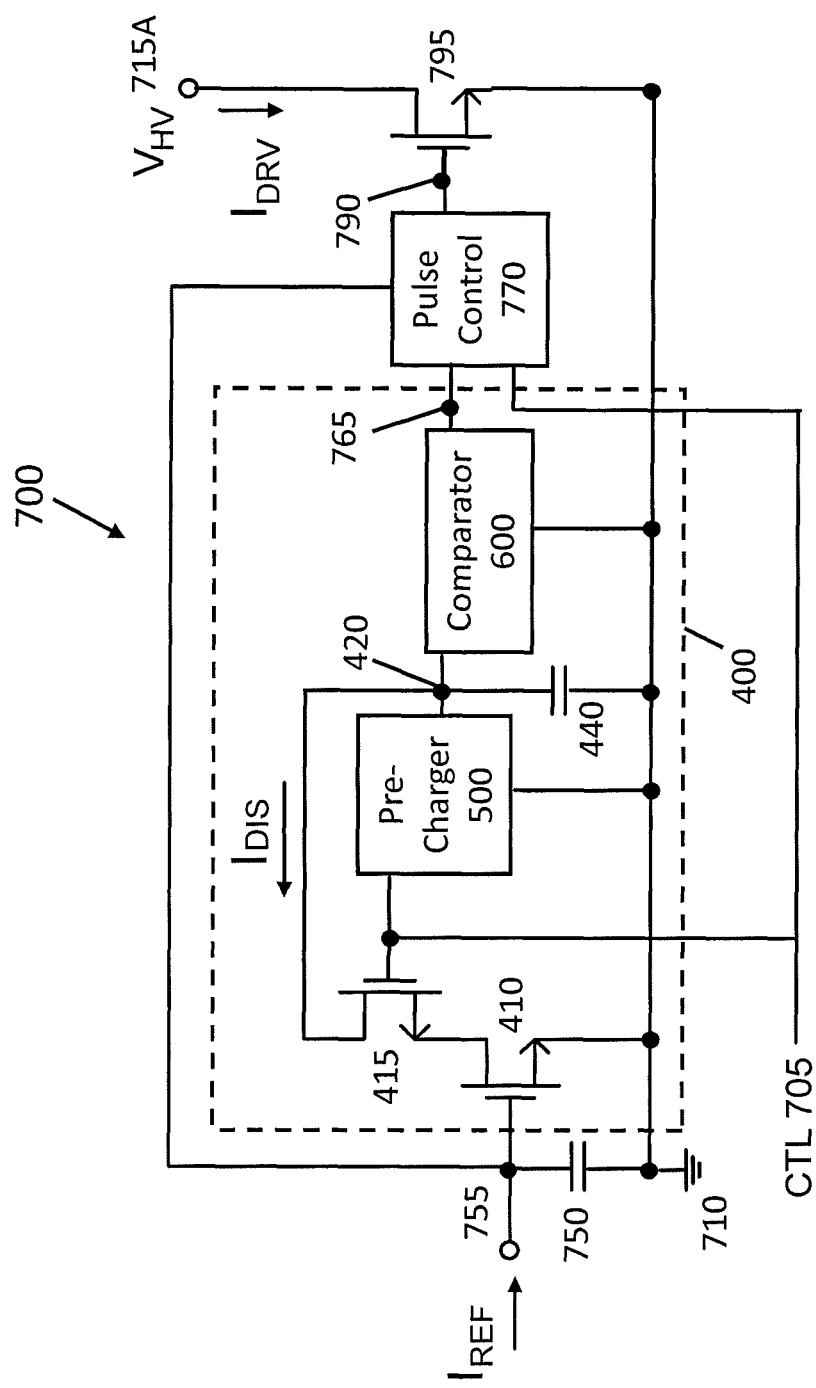
FIG. 7 illustrates an adjustable current driver circuit including the shutdown controller shown in FIG. 4, the pre-charger circuit shown in FIG. 5, and the shutdown signal generator shown in FIG. 6 according to the present invention.

FIG. 7 illustrates the SD timer 400 employed in an adjustable current driver circuit 700 according to the present invention. Adjustable current driver circuit 700 is similar to the adjustable current driver circuit 300 shown in FIG. 3, but includes the details of SD timer 400 shown in FIG. 4 instead of the block diagram form of SD timer 360 shown in FIG. 3, and $I_{REF}$ is applied directly to node 755. SD timer 400 includes the pre-charger circuit 500 shown in FIG. 5 and the comparator 600 shown in FIG. 6. $I_{REF}$ is applied directly node 755, charging storage capacitor 750 and causing transistor 410 to generate $I_{DIS}$ for discharging timer capacitor 440.

In response to CTL 705 indicating driving transistor 795 is to be turned off, $I_{REF}$ stores charge in storage capacitor 750. Transistor 415 acts as an open switch blocking $I_{DIS}$, and pre-charger circuit 500 stores charge in timer capacitor 440. In response to CTL 705 indicating driving transistor 795 is to be turned on, the charge stored in storage capacitor 750 is applied to the gate terminal of driving transistor 795 and allows it to generate $I_{DRV}$. Transistor 415 acts as a closed switch, allowing $I_{DIS}$ to drain the charge stored in timer capacitor 440.

In response to $I_{REF}$ indicating a high magnitude for $I_{DRV}$, $I_{DIS}$ is larger and quickly decreases the voltage on node 420 from timer capacitor 440 below the threshold voltage of comparator 600, causing it to generate shutdown signal 765 for pulse controller 770 to turn off driving transistor 795 after only a short delay. In response to $I_{REF}$ indicating a low magnitude for $I_{DRV}$, $I_{DIS}$ slowly decreases the voltage on node 420 from timer capacitor 440 below the threshold voltage for comparator 600, causing it to generate shutdown signal 765 for pulse controller 770 to turn off driving transistor 795 only after a long delay.

The above description and drawings are only to be considered illustrative of specific embodiments, which achieve the features and advantages described herein. Modifications and substitutions to specific circuits and process conditions can be made. Accordingly, the embodiments of the invention are not considered as being limited by the foregoing description and drawings.

What is claimed is:

1. A driver shutdown circuit for providing an emergency shutdown signal to a gate driver circuit connected to an output node, comprising:
   a first gallium nitride (GaN) field effect transistor (FET) for generating a discharging current and having a gate terminal connected to an input node, a drain terminal, and a source terminal connected to ground;
   a second GaN FET for allowing or blocking the discharging current based on a control signal and having a gate terminal for receiving the control signal, a drain terminal connected to a first node, and a source terminal connected to the drain terminal of the first GaN FET;
   a timer capacitor configured to be discharged by the discharging current and having a first terminal connected to the first node and a second terminal connected to ground;
   a pre-charger circuit connected to the first node and configured to:
      receive an inverse of the control signal, and
      charge the timer capacitor to a predetermined voltage; and
   a comparator, connected to the first node and the output node, for generating the emergency shutdown signal for the gate driver if a voltage on the first node decreases below a threshold.

2. The driver shutdown circuit of claim 1, wherein the pre-charger circuit comprises:
   a current source connected to a second node;
   an output stage connected to the second node, comprising:
      a third GaN FET having a gate terminal connected to the second node, a drain terminal connected to a supply voltage, and a source terminal connected to a third node, and
      a fourth GaN FET having a gate terminal configured to receive the inverse of the control signal, a drain terminal connected to the third node, and a source terminal connected to ground;
   a fifth GaN FET having a gate terminal connected to the third node, a drain terminal connected to the supply voltage, and a source terminal connected to the first node; and
   a feedback circuit, connected to the second node and the third node, for maintaining a predetermined voltage on the third node.

3. The driver shutdown circuit of claim 2, wherein the current source comprises a resistor having a first terminal connected to the second node and a second terminal connected to the supply voltage.

4. The driver shutdown circuit of claim 2, wherein the current source comprises a depletion mode GaN FET having a drain terminal connected to the supply voltage, and a gate terminal and a source terminal connected together to the second node.

5. The driver shutdown circuit of claim 2, wherein the pre-charger circuit further comprises an additional resistor having a first terminal connected to the drain terminal of the fifth GaN FET and a second terminal connected to the second node, wherein the resistor has a resistance such that a voltage across it is less than a threshold voltage of the third GaN FET.

6. The driver shutdown circuit of claim 2, wherein the feedback circuit comprises a current mirror.

7. The driver shutdown circuit of claim 1, wherein the comparator comprises an inverter.

8. The driver shutdown circuit of claim 1, wherein the comparator comprises:
   a current source connected to a second node;
   a first output stage connected to the second node, comprising:
      a third GaN FET having a gate terminal connected to the second node, a drain terminal connected to a supply voltage, and a source terminal connected to a third node, and
      a fourth GaN FET having a gate terminal connected to the first node, a drain terminal connected to the third node, and a source terminal connected to ground;
   a feedback circuit, connected to the second node and the third node, for maintaining a predetermined voltage on the third node; and
   a second output stage connected to the first output stage, comprising:
      a fifth GaN FET having a gate terminal connected to the third node, a drain terminal connected to the supply voltage, and a source terminal connected to the output node, and
      a sixth GaN FET having a gate terminal connected to the first node, a drain terminal connected to the output node, and a source terminal connected to ground.

9. The driver shutdown circuit of claim 8, wherein the current source comprises a resistor having a first terminal connected to the second node and a second terminal connected to the supply voltage.

10. The driver shutdown circuit of claim 8, wherein the current source comprises a depletion mode GaN FET having a drain terminal connected to the supply voltage, and a gate terminal and a source terminal connected together to the second node.

11. The driver shutdown circuit of claim 8, wherein the comparator further comprises a resistor having a first terminal connected to the drain terminal of the fifth GaN FET and a second terminal connected to the second node, wherein the resistor has a resistance such that a voltage across it is less than a threshold voltage of the third GaN FET.

12. The driver shutdown circuit of claim 8, wherein the feedback circuit comprises a current mirror.

13. The driver shutdown circuit of claim 1, wherein the gate driver circuit is configured to receive an input current at the input node and comprises:
   a storage capacitor connected to the input node;
   a pulse controller circuit connected to the input node, the output node, and a second node, and configured to:
      receive the control signal and the emergency shutdown signal, and
      drive a power transistor based on the control signal and the emergency shutdown signal; and
   the power transistor comprising a third GaN FET having a gate terminal connected to the second node, a drain terminal connected to a second supply voltage, and a source terminal connected to ground, wherein the second supply voltage is greater than the first supply voltage.

\* \* \* \* \*